US009099958B2

(12) United States Patent
Trotta

(10) Patent No.: US 9,099,958 B2
(45) Date of Patent: Aug. 4, 2015

(54) SYSTEM AND METHOD FOR A VOLTAGE CONTROLLED OSCILLATOR

(71) Applicant: Infineon Technologies AG, Neubiberg (DE)

(72) Inventor: Saverio Trotta, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/041,931

(22) Filed: Sep. 30, 2013

(65) Prior Publication Data
US 2015/0091663 A1    Apr. 2, 2015

(51) Int. Cl.
H03B 5/08    (2006.01)
H03B 5/12    (2006.01)
H03B 1/00    (2006.01)
H03B 5/18    (2006.01)

(52) U.S. Cl.
CPC ............... *H03B 5/1231* (2013.01); *H03B 1/00* (2013.01); *H03B 5/1847* (2013.01)

(58) Field of Classification Search
CPC ................................. H03B 5/1847; H03B 1/00
USPC .................... 331/117 FE, 117 R, 167, 177 V
See application file for complete search history.

(56) References Cited

U.S. PATENT DOCUMENTS

| 8,324,977 | B2  | 12/2012 | Li et al.      |           |
|-----------|-----|---------|----------------|-----------|
| 2004/0032303 | A1* | 2/2004  | Saito et al. | 331/177 V |
| 2006/0049880 | A1* | 3/2006  | Rein et al.  | 331/74    |
| 2011/0043401 | A1  | 2/2011  | Li             |           |
| 2011/0267147 | A1* | 11/2011 | Trotta         | 331/108 R |
| 2011/0267149 | A1* | 11/2011 | Trivedi        | 331/117 R |
| 2012/0049967 | A1* | 3/2012  | Trivedi        | 331/108 R |

OTHER PUBLICATIONS

Buisman, K. et al., "RF Power Insensitive Varactors," IEEE Microwave and Wireless Components Letters, vol. 22, No. 8, Aug. 2012, pp. 418-420.

* cited by examiner

*Primary Examiner* — Arnold Kinkead
(74) *Attorney, Agent, or Firm* — Slater & Matsil, L.L.P.

(57) ABSTRACT

In accordance with an embodiment, a voltage controlled oscillator (VCO) includes a VCO core having a plurality of transistors, a bias resistor coupled between collector terminals of the VCO core and a first supply node, and a varactor circuit coupled to emitter terminals of the VCO core. The bias resistor is configured to limit a self-bias condition of the VCO core.

20 Claims, 11 Drawing Sheets

SYSTEM AND METHOD FOR A VOLTAGE CONTROLLED OSCILLATOR

TECHNICAL FIELD

The present disclosure relates generally to an electronic device, and more particularly to a system and method for a voltage controlled oscillator (VCO).

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy and sensitivity of the radar system may depend, in part, on the phase noise performance and frequency agility of the radar's frequency generation circuitry, which generally includes an RF oscillator and circuitry that controls the frequency of the RF oscillator.

As the operating frequencies of RF systems continue to increase, however, the generation of signals at such high frequencies poses a major challenge. Oscillators that operate at high frequencies may suffer from a poor phase noise performance that caused by 1/f and thermal noise in the devices that comprise the VCO. Phase noise may be further compromised by non-linear effects of self-bias conditions that affect the gain and tuning characteristics of the VCO.

SUMMARY OF THE INVENTION

In accordance with an embodiment, a voltage controlled oscillator (VCO) includes a VCO core having a plurality of transistors, a bias resistor coupled between collector terminals of the VCO core and a first supply node, and a varactor circuit coupled to emitter terminals of the VCO core. The bias resistor is configured to limit a self-bias condition of the VCO core.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a radar system, such as an automotive radar system. The invention may also be applied to other systems and applications that use RF oscillators, such as general radar systems and wireless communications systems.

In embodiment s of the present invention, a low phase-noise VCO utilizes a feedback resistor to reduce the effect of self-biasing during operation. This reduction of self-biasing also mitigates the distortion of the varactor tuning characteristic caused by modulation of the varactor during operation of the VCO, thereby preventing unexpected variation of VCO gain that may increase phase noise within a frequency generation system such as a phase locked loop (PLL) or reduce the locking range of the same PLL. Further phase noise rejection may be achieved by decoupling harmonics of the VCO core from the varactor.

Figure 1A:
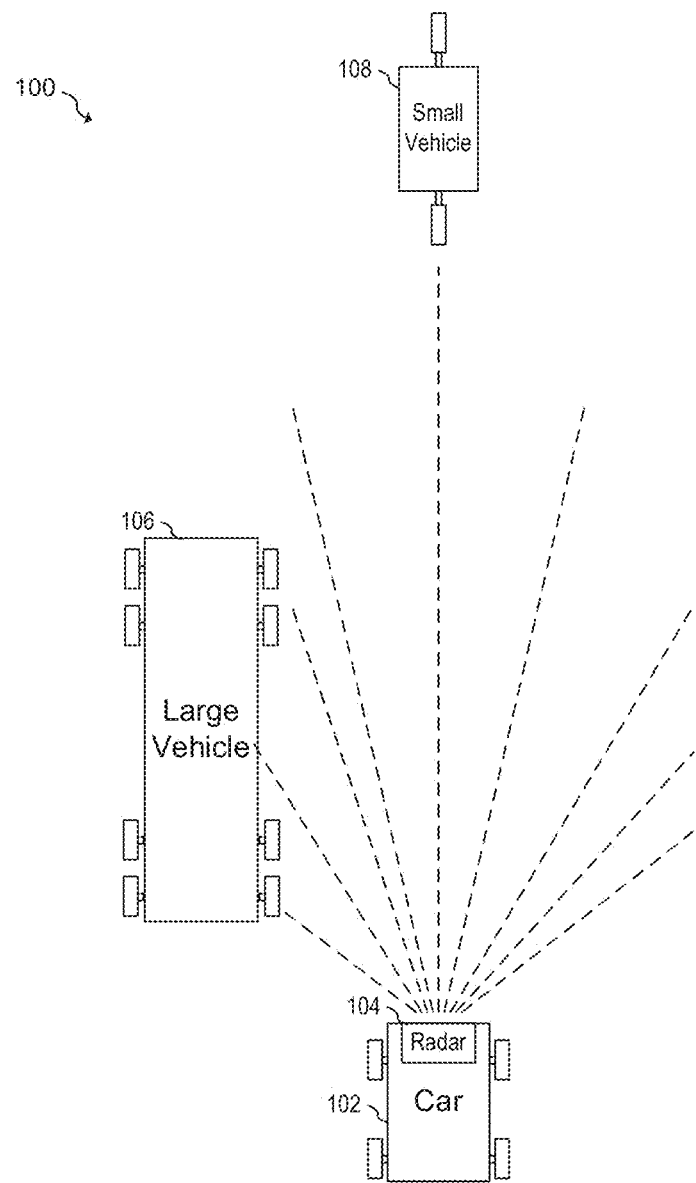
FIGS. 1a-d illustrate the operation of an example automotive radar system, a schematic of a conventional VCO, and a performance of the conventional VCO.

FIG. 1a illustrates an example automotive radar scenario 100 in which automobile 102 has automotive radar system 104. Automotive radar system 104 transmits and receives, for example, a frequency modulated continuous wave (FMCW) signal, and detects reflections of this transmitted signal in order to determine a distance between automotive radar system 104 and other vehicles or objects on the road. In the illustrated scenario, a large vehicle 106, such as a truck is closer to automobile 102 then a small vehicle 108, such as a motorcycle. Under normal operating conditions, the echo or reflection off large vehicle 106 will be of a higher amplitude then the reflection off small vehicle 108 because large vehicle 106 is both larger and closer than small vehicle 108.

Figure 1B:
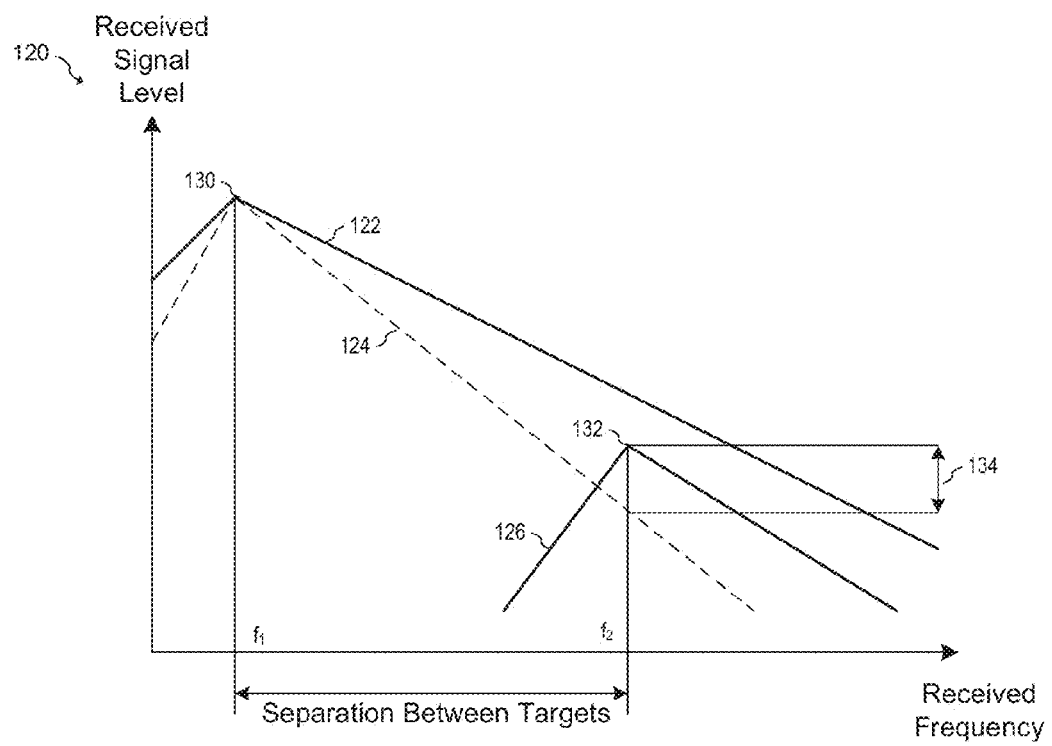

FIG. 1b illustrates a graph 120 of received signal level versus received frequency for the scenario of FIG. 1a. Signal level versus frequency curve 122 corresponds to the received reflection from large vehicle 106 and the frequency f1 of signal level peak 130 corresponds to the distance between automotive radar system 104 and large vehicle 106. Likewise, signal level versus frequency curve 126 corresponds to the received reflection from small vehicle 108 and the frequency F2 of the signal level peak 132 corresponds to the distance between automotive radar system 104 and small vehicle 108. Accordingly, the distance between large vehicle 106 and small vehicle 108 is proportional to the separation between frequencies F1 and F2.

Along with the desired output signal, the phase noise of the radar transmitter is also transmitted and reflected. The phase noise reflected from large vehicle 106 is represented as dashed line 124. As seen in graph 120, phase noise 124 affects the ability of the radar to receive signals reflected from small vehicle 108. The signal to noise ratio between signal level peak 132 due to small vehicle 108 and the corresponding noise floor due to phase noise reflected from large vehicle 106 is represented as length 134. It can be seen from the graph of FIG. 1B, that phase noise affects the ability of automotive radar system 104 to discern small and distant objects. The higher the phase noise of the radar transmitter, the less able the radar system is able to discern small and distant objects.

Figure 1C:
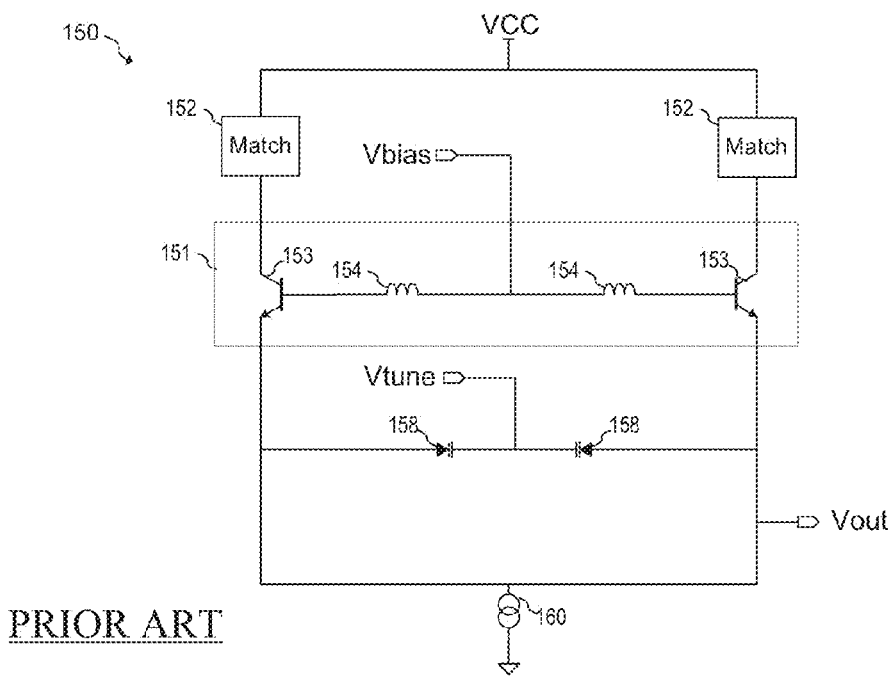

FIG. 1c illustrates conventional VCO 150 according to a "push-push" architecture. VCO includes VCO core 151 having transistors 153 and inductors 154, matching networks 152, varactors 158 and current source 160. Transistors 153 are biased according to bias voltage Vbias, and the capacitance of varactors 158 are tuned according to tuning voltage Vtune. The frequency of oscillation of VCO 150 is approximately:

$$f_{OSC} = \frac{1}{2\pi\sqrt{L_{154}C_{158}}},$$

where $L_{154}$ is the inductance of inductor 154 and $C_{158}$ is the capacitance of varactor 158. The output of VCO 150 is taken a Vout, which provides an output frequency of twice $f_{OSC}$.

Figure 1D:
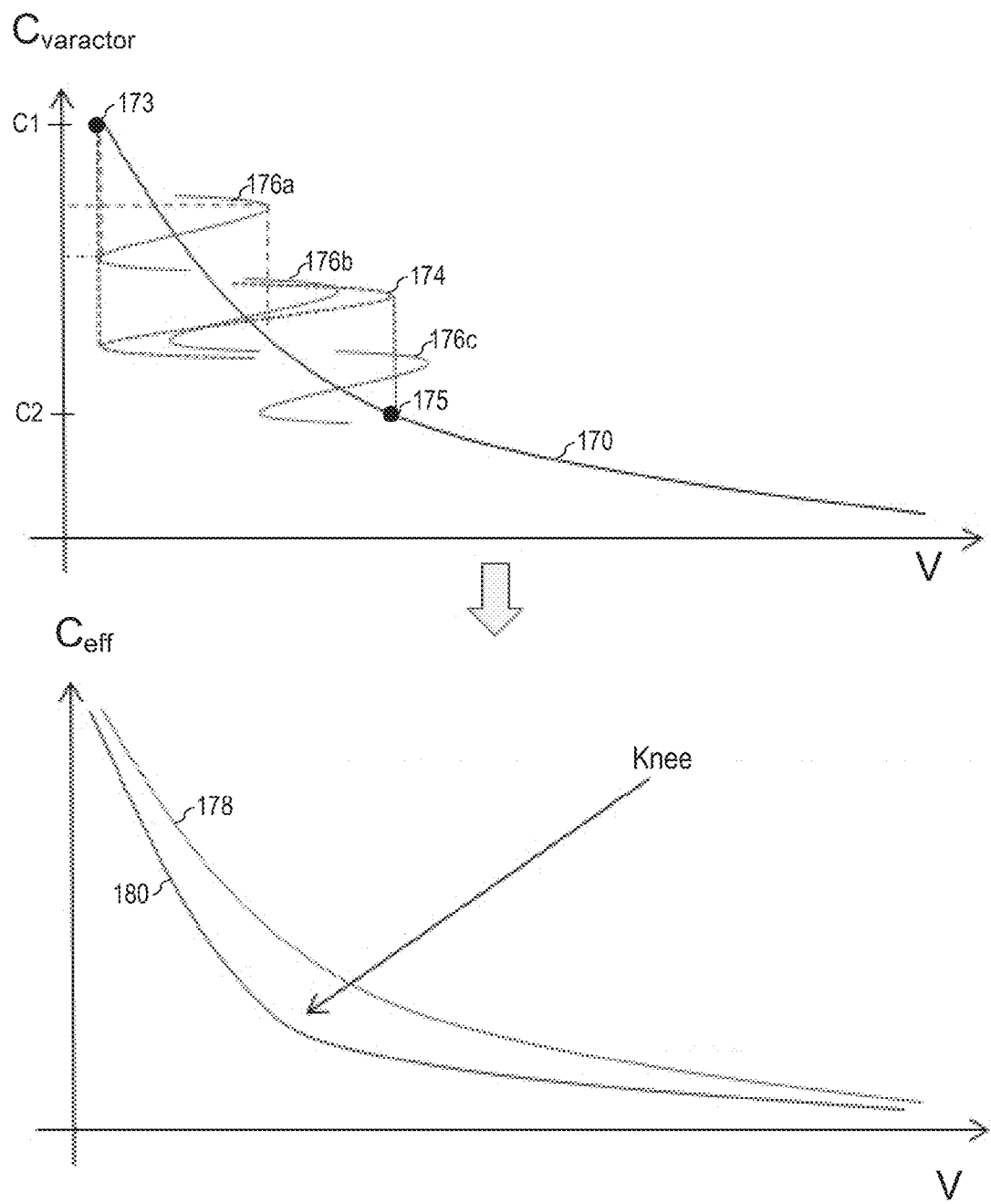

Varactor 158 may be implemented as a diode capacitance that is inversely proportional to the voltage applied across its terminals. This decrease in applied voltage may be due to the increase of the width of the depletion region in the reversed bias diode that causes a corresponding decrease in its capacitance. An example relationship between the DC varactor capacitance $C_{varactor}$ with respect to tuning voltage is shown as curve 170 in FIG. 1d. As shown, that $C_{varactor}$ decreases with increasing voltage. During operation of the VCO, however, the actual voltage across varactor 158 various with time during each oscillation cycle of the VCO, therefor causing the capacitance to vary during each oscillation cycle of the VCO. Curves 174, 176a, 176b and 176c represent the variance in the applied tuning voltage across varactor 158 due to the change in output of the VCO over a cycle. Curves 176a-c represent a small VCO amplitude and curve 174 represents a large VCO amplitude. As shown, when the VCO produces a large amplitude represented by curve 174, the capacitance of varactor 158 varies from the capacitance value C1 corresponding to point 173 on the curve 170 to capacitance value C2 corresponding to point 175 on curve 170. The net practical effect in this large signal behavior causes a change in the effective tuning characteristic of varactor 158. These effective tuning characteristics are represented as $C_{eff}$ in FIG. 1c. Curve 178 represents the effective tuning characteristic corresponding to small amplitude curves 176a-c, and curve 180 represents the effective tuning characteristic corresponding to large amplitude curve 174. As shown, curve 180 representing the $C_{eff}$ for a large signal amplitude has a "knee" in its tuning characteristic. This "knee" may effect a reduced VCO gain that can affect the capability of a PLL to achieve frequency lock across the VCO tuning range, and can increase the phase noise when the VCO operates in high $K_{VCO}$ tuning range.

Figure 2A:
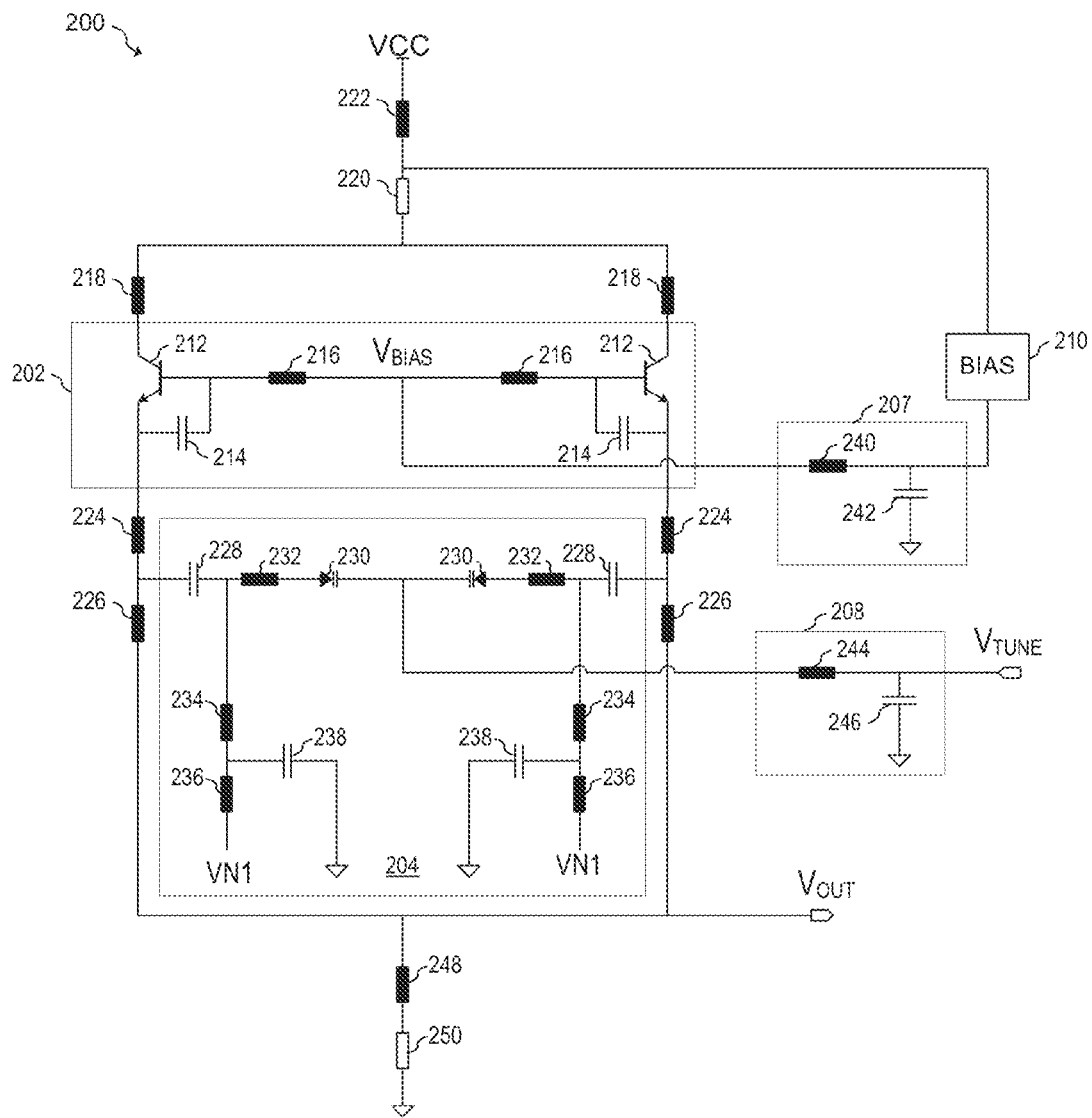
FIGS. 2a-b illustrate schematics of embodiment VCOs.

FIG. 2a illustrates the VCO 200 according to an embodiment of the present invention, which includes VCO core 202, varactor circuit 204 containing varactors 230, and bias circuit 210. In an embodiment, VCO core includes transistors 212, capacitors 214 and transmission line elements 216. In an embodiment, VCO is configured to oscillate at a frequency between about 5 GHz and about 40 GHz, for example, about 20 GHz. However, in alternative embodiments, other oscillation frequency ranges may be used. Transmission line elements 216 are sized in order to produce an inductive impedance at the bases of transistors 212. Bias voltages to the bases of transistors 212 are provided by bias circuit 210 that is coupled to VCC via transmission line element 222. In an embodiment, transmission line element 222 is sized to be a quarter wavelength at twice the frequency of oscillation of the VCO 200. In some embodiments, bias voltage VBIAS is filtered via bias filtering network 207 having transmission line element 240 and capacitor 242. In some embodiments, transmission line element 240 has a quarter wavelength of about four times the oscillation frequency of VCO 200.

The collectors of transistors 212 are coupled to VCC via transmission line elements 218, feedback resistor 220 and transmission line element 222. In an embodiment, transmission line elements 218 are sized in order to maximize the signal swing. Feedback resistor 220, in some embodiments, mitigates the self-bias effect of high VCO amplitudes distorting the tuning curve of varactors 230. For example, under low temperature and/or fast process corner conditions, the tendency of the gain and current of transistors 212 to increase, which results in a larger signal swing in the VCO and varactor node, is counterbalanced by the effect of feedback resistor 220. An increase in bias current and/or signal swing that results in increase current causes a corresponding voltage drop across feedback resistor 220. This voltage drop reduces the signal swing of VCO core 202 and therefore decreases the effects of the self-bias effect on the VCO tuning characteristic. Under high temperature and/or slow process corner conditions, on the other hand, the tendency of the gain and current of transistors 212 to decrease limits the occurrence of self-biasing, such that the additional voltage drop across feedback resistor 220 is negligible and/or does not cause an appreciable decrease in VCO amplitude. In some embodiments, the resistance of feedback resistor is between about 5Ω and about 10Ω for a bias current of about 20 mA. Alternatively, bias currents and other resistance values for feedback resistor 220 may be used.

Varactor circuit 204 includes varactor elements 230, AC coupling capacitors 228, series transmission line elements 232, and RF choke circuits that include transmission line elements 234 and 236 and capacitor 238. In some embodiments, tuning voltage $V_{TUNE}$ is filtered via bias filtering network 208 having transmission line element 244 and capacitor 246. In some embodiments, transmission line element 240 has a quarter wavelength of about four times the oscillation frequency of VCO 200. The combination of each RF choke circuit and transmission line element 232 may form an inductive voltage divider. In an embodiment, AC coupling capacitors 228 allow varactors 230 to be biased based on applied tuning voltage Vtune and reference voltage Vn1. Series transmission line elements 232 and AC coupling capacitors 228 forms a series resonant circuit that allows the fundamental frequency of oscillator pass to varactors while attenuating the harmonics of VCO 200. In some embodiments, series transmission line elements 232 may be implemented using a transmission line having a length of about 400μ in one example. In another example, the length of series transmission line elements 232 may be between about 100μ and about 500μ. It should be understood, however, that the length of series transmission line elements 232 may be outside of this range depending on the embodiment and its particular specifications. In some alternative embodiments, series transmission line elements 232 may be implemented using an inductive element.

In an embodiment, the RF choke circuit that includes transmission line elements 234, 236 and capacitor 238 produces a high impedance to the emitters of transistors 212 at about twice the oscillation frequency of VCO 200, and provides a lower impedance at other harmonics of the oscillation frequency. By providing a lower impedance to oscillation harmonics via series transmission line element 232 and the RF choke circuit, phase noise may be improved due because of reduced non-linear behavior of the varactor.

Output $V_{OUT}$ of VCO 200 is coupled to the emitters of transistors 212 via transmission line elements 224 and 226 that isolate the VCO core from the output, thereby forcing the fundamental signal of the VCO to remain in the VCO core. This also improves the quality factor of the resonator and leads to better phase noise performance. The tail current for transistors 212 is provided by transmission line element 248 and resistor 250. In an embodiment, transmission line element 248 has a quarter wavelength at twice the frequency of oscillation of VCO 200.

It should be understood that, in some embodiments, the sizing of transmission elements within VCO 200 may vary from the lengths and corresponding wavelengths described above depending on the particular embodiment and its specifications.

Figure 2B:
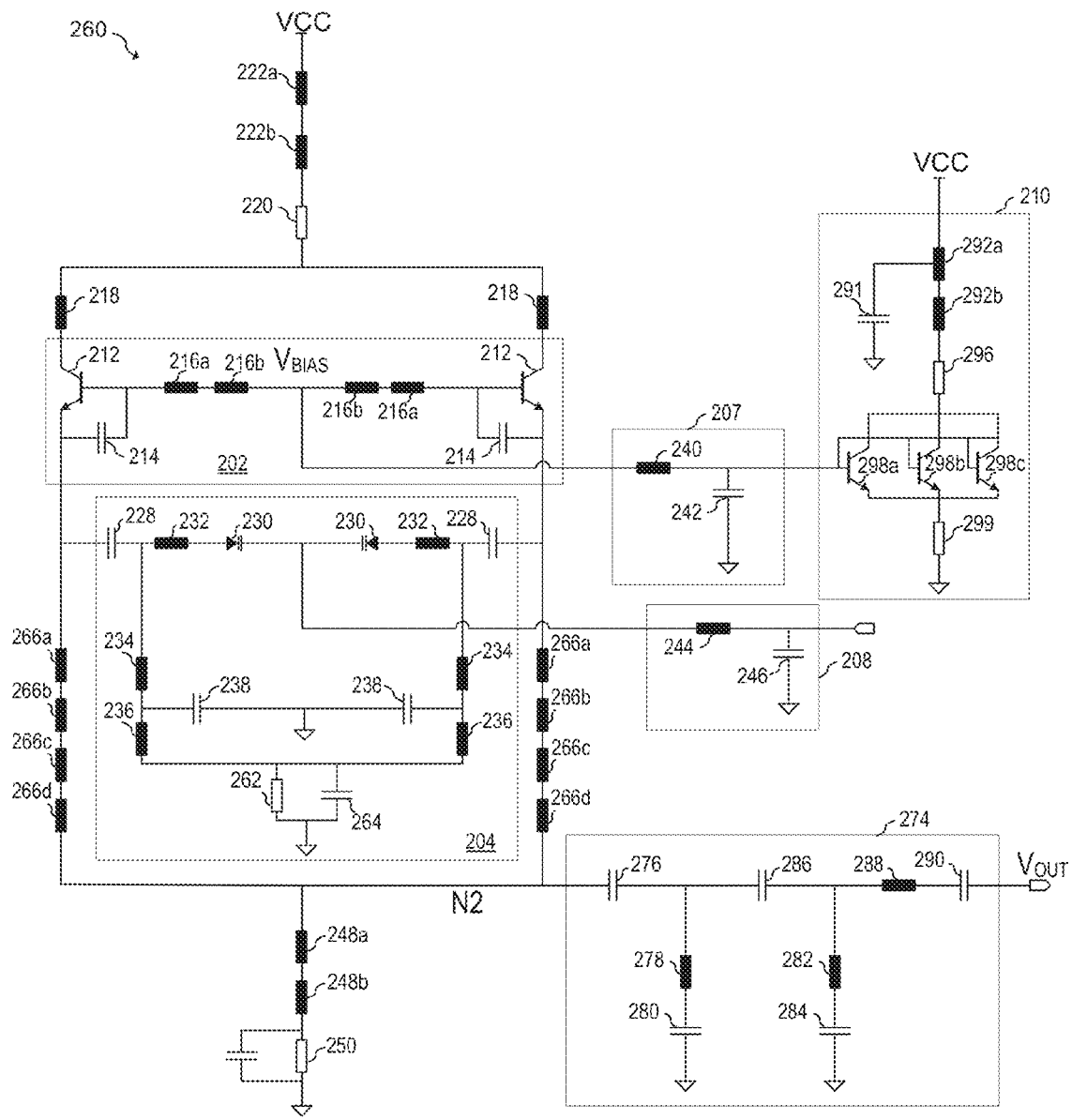

FIG. 2b illustrates VCO 260 according to a further embodiment of the present invention. VCO 260 is similar to VCO 200 shown in FIG. 2a, with the addition of output filter 274, and various alternative implementation details. In an embodiment, transmission line element 222 is split into series transmission line elements 222a and 222b, transmission line element 248 is split into series transmission line elements 248a and 248b, and transmission line elements 216 are split into series transmission line elements 216a and 216b. Likewise, the emitters of transistors 212 are coupled to common node N2 via transmission line elements 266a-d. In varactor circuit 204, transmission line elements 236 are coupled to ground via resistor 262 and capacitor 264.

In an embodiment, bias circuit 210 provides bias voltage $V_{BIAS}$ via transmission lines elements 292a-b, resistor 296, diode coupled transistors 298a-c and capacitor 291. The emitters of transistors 298a-c are coupled to ground via resistor 299. Output filter 274 is coupled between node N2 and output port $V_{OUT}$. In one embodiment, filter 274 has is a bandpass filter having a center frequency of about two times the oscillation frequency of VCO 260. Alternatively, other filter types and center frequencies may be used. Filter 274 is implemented as an LC ladder circuit having capacitors 276, 280, 284, 286 and 290, and inductors implemented using transmission line elements 278, 282 and 288. In further alternative embodiments, the inductors may be implemented using discrete or on-chip inductors.

Figure 3A:
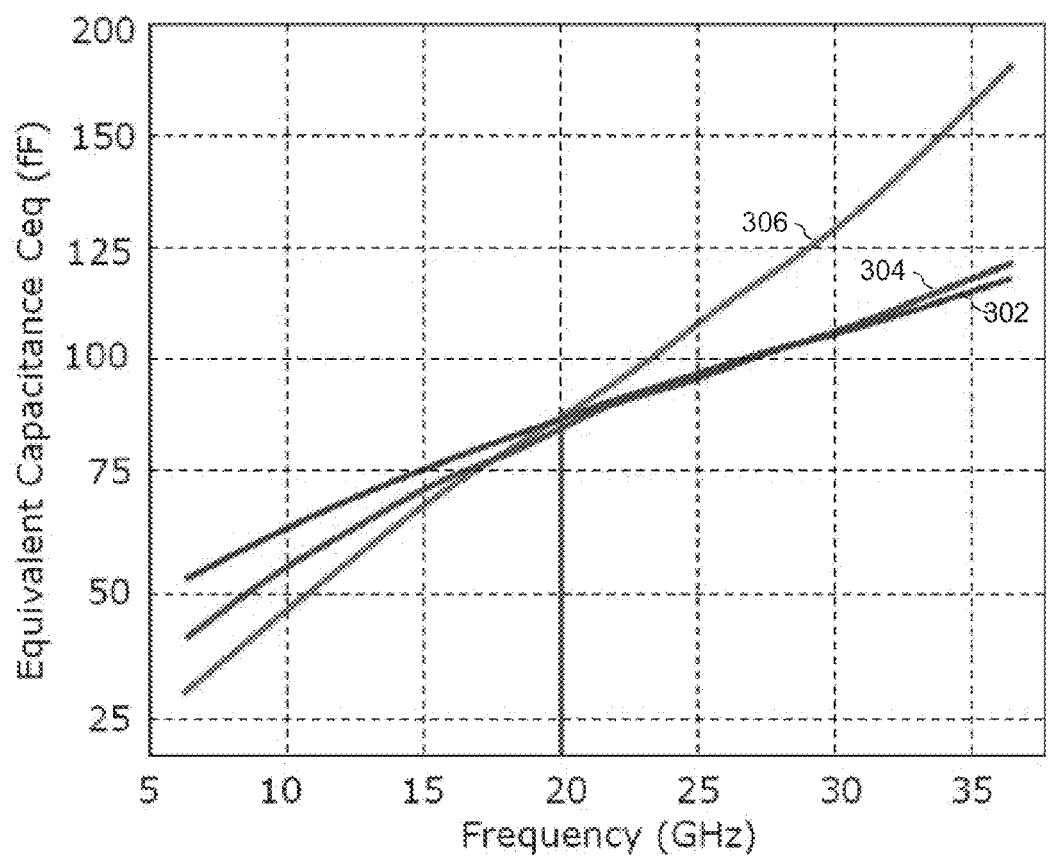
FIGS. 3a-f illustrate performance results of embodiment VCOs.

FIG. 3a illustrates a series of curves that represent equivalent capacitance over frequencies with respect to various embodiment architectures. Curve 302 represents the performance of a VCO having feedback resistor 220 but not series transmission line elements 232 and not the RF choke made of transmission line elements 234, 236 and capacitor 238; curve 304 represents the performance of a VCO having feedback resistor 220, and the RF choke made of transmission line elements 234, 236 and capacitor 238, but not series transmission line elements 232; and curve 306 represents the performance of a VCO having feedback resistor 220, the RF choke made of transmission line elements 234, 236 and capacitor 238, and series transmission line elements 232. As can be seen, curve 306 has a higher effective capacitance at higher frequencies and a lower effective capacitance at lower frequencies, thereby increasing the tuning range of the VCO.

Figure 3B:
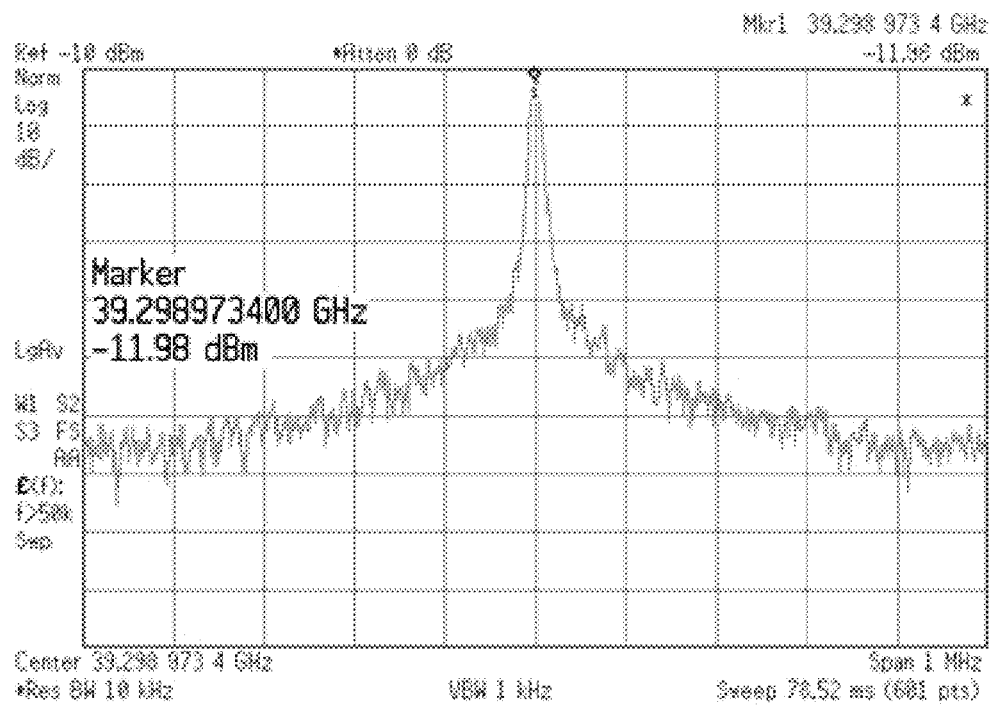
Figure 3C:
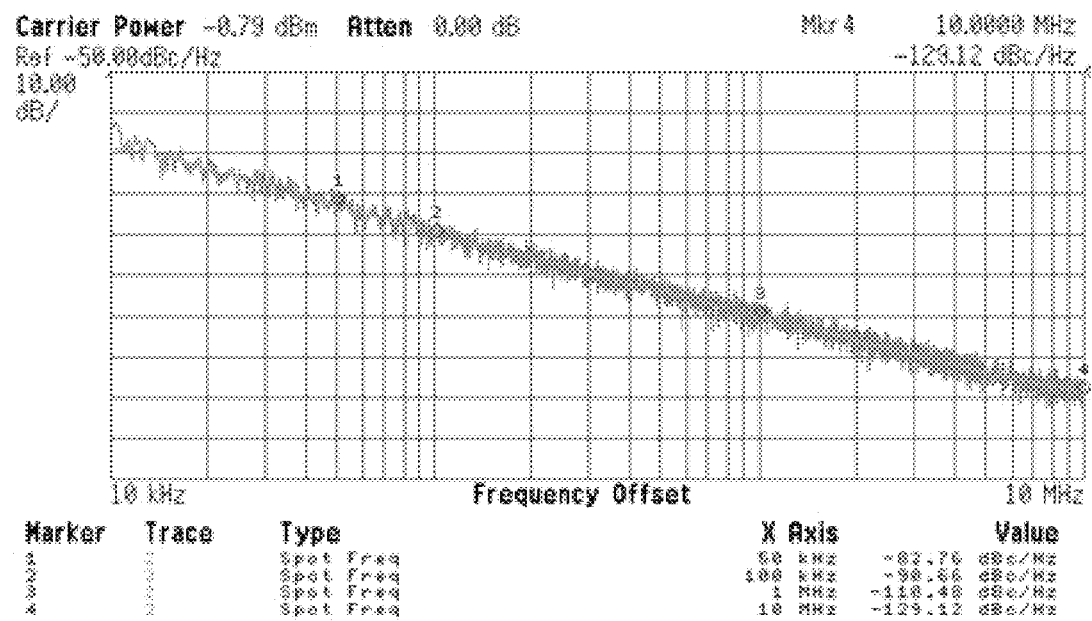

FIG. 3b illustrates a measured spectral plot of output $V_{OUT}$ of VCO 200 shown in FIG. 2a. Here, the output frequency of VCO 200 is about 40 GHz, which is twice the frequency of oscillation of the VCO of 20 GHz. FIG. 3c illustrates a phase noise plot showing the phase noise performance of VCO 200.

As shown, the phase noise is about −82.76 dBc/Hz at a 50 KHz offset, −90.66 dBc/Hz at a 100 KHz offset, −110.48 dBc/Hz at a 1 MHz offset, and −129.12 dBc/Hz at a 10 MHz offset.

Figure 3D:
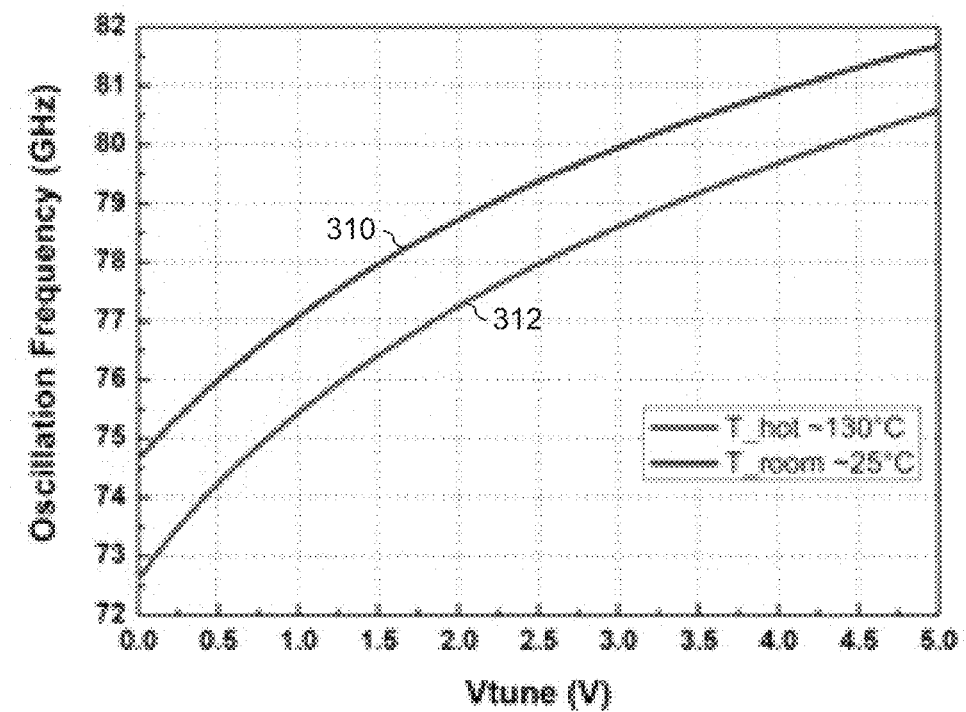
Figure 3E:
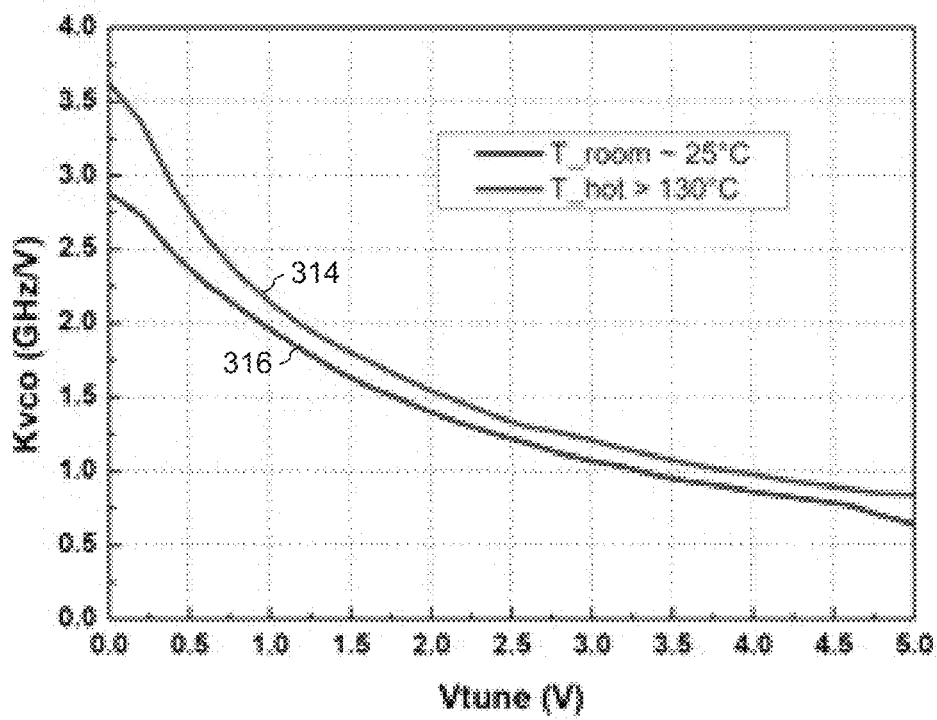
Figure 3F:
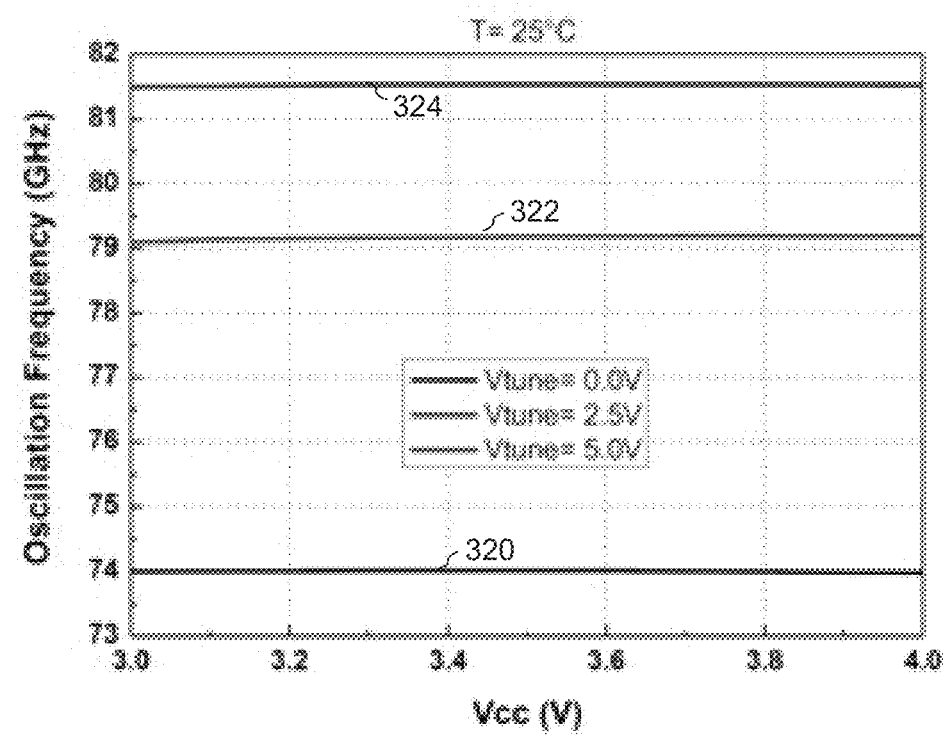

FIG. 3d illustrates plots of oscillation frequency with respect to tuning voltage for an embodiment VCO. Trace 310 represents the oscillation frequency with respect to tuning voltage at 25° C. and trace 312 represents the oscillation frequency with respect to tuning voltage at 130° C. FIG. 3e illustrates plots of VCO gain (KVCO) with respect to tuning voltage for the embodiment VCO characterized in FIG. 3d. Trace 316 represents the VCO gain with respect to tuning voltage at 25° C. and trace 314 represents the oscillation frequency with respect to tuning voltage at 130° C. FIG. 3f illustrates the frequency of oscillation with respect to supply voltage VCC over various tuning voltages at 25° C. Trace 320 represents the frequency of oscillation with a tuning voltage of about 0 V; trace 322 represents the frequency of oscillation with a tuning voltage of about 2.5 V; and trace 324 represents the frequency of oscillation with a tuning voltage of about 5.0 V. It should be understood that the plots of FIGS. 3a-f illustrate the performance of example embodiments. Other embodiment VCOs may perform differently from what is illustrated in FIGS. 3a-f.

Figure 4:
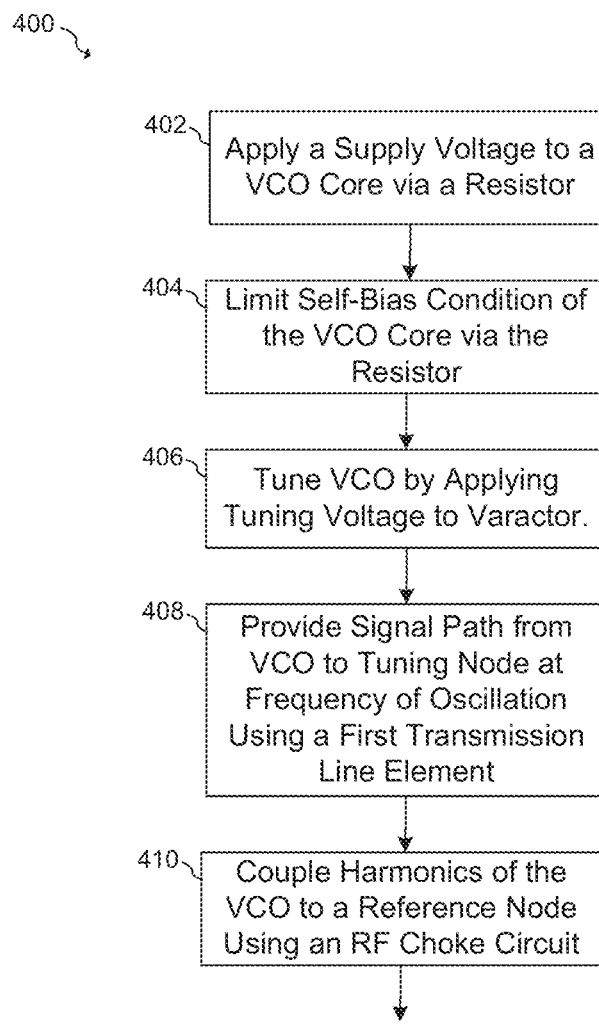
FIG. 4 illustrates a block diagram of an embodiment method.

FIG. 4 illustrates a block diagram 400 of an embodiment method of operating a VCO. In step 402, a supply voltage is applied to a VCO core via a resistor. In one embodiment, the VCO core and feedback resistor may be implemented using a circuit similar to VCO core 202 and feedback resistor 220 shown in FIG. 2a. In step 404, a self-bias condition may be limited using this resistor. In some embodiments, limiting the self-bias condition may mitigate the effects of self-biasing on the effective capacitance of the VCO. In step 406, the VCO is tuned by applying a tuning voltage to a varactor, and in step 408, a signal path between the VCO core and the varactor is provided at the frequency of oscillation. In some embodiments, this signal path is implemented using a series resonant circuit having an AC coupling capacitor and a transmission line element coupled between the VCO core and a running node, for example, as shown in FIG. 2a with respect to AC coupling capacitors 228 and series transmission line elements 232. In step 410, harmonics of the VCO are shunted to a reference node, such as ground, using, for example an RF choke circuit. By performing steps 408 and 410, harmonics of the VCO that are coupled onto the varactor are attenuated, thereby improving phase noise performance in some embodiments.

Figure 5:
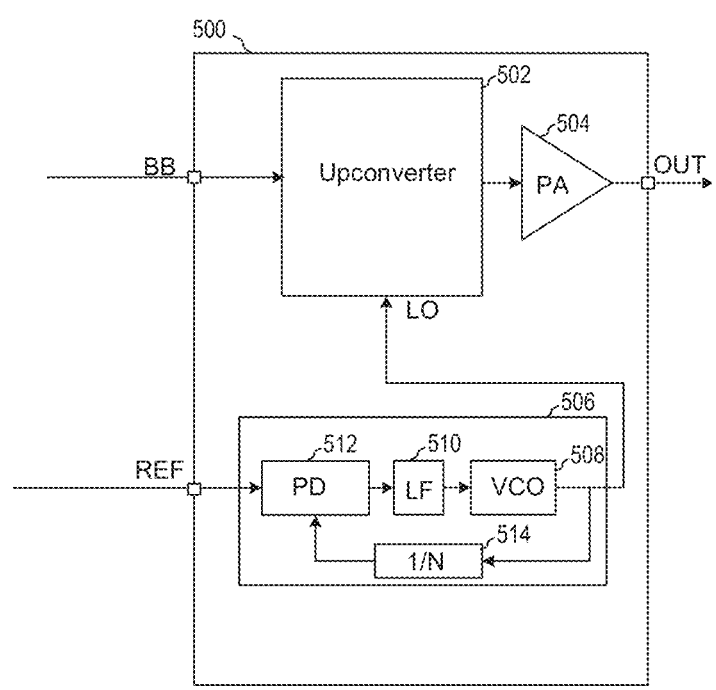
FIG. 5 illustrates an embodiment radar system.

FIG. 5 illustrates single-chip radar transmission system 500 that includes upconverter 502, power amplifier 504 and frequency generation circuit 506. As shown, upconverter 502 upconverts baseband signal BB to a higher frequency signal, which is then amplified by power amplifier 504 and output on pin OUT. In some embodiments, baseband signal BB may be a swept frequency or other signal type used in a radar system. Frequency generation circuit 506 produces local oscillator signal LO based on a reference frequency on pin REF that may be generated using, for example, a crystal oscillator. In an embodiment, frequency generation circuit 506 is implemented using a phase locked loop (PLL) having phase detector 512, loop filter 510, VCO 508 and divider 514. VCO 508 may be implemented using embodiment VCOs described herein. It should be appreciated that system 500 is just one of many examples of embodiment systems that may utilize embodiment oscillators. Alternative systems may include, for example, wireless and wire line communication systems, and other systems that use VCOs.

In accordance with an embodiment, a voltage controlled oscillator (VCO) includes a VCO core having a plurality of transistors, a bias resistor coupled between collector terminals of the VCO core and a first supply node, and a varactor circuit coupled to emitter terminals of the VCO core. The bias resistor is configured to limit a self-bias condition of the VCO core.

In an embodiment, the varactor circuit includes a first capacitor having a first terminal coupled to an emitter node of the VCO core, a first transmission line element having a first terminal coupled to a second terminal of the first capacitor, a first varactor diode having a first terminal coupled to a second terminal of the first transmission line and a second terminal coupled to a tuning node, an RF choke circuit coupled between a second terminal of the first capacitor and a second reference node. The first transmission line may include a length of at least 100 µm, the RF choke circuit may have a quarter wavelength at about twice a frequency of operation of the VCO. In some embodiments, the first transmission line and the RF choke form an inductive voltage divider.

In an embodiment, The VCO further includes a fourth transmission line element coupled between the tuning node and an input tuning terminal, a third capacitor coupled between the input tuning terminal and the second reference node, a fifth transmission line element coupled between a base bias node of the VCO core and an output node of a bias circuit, and a fourth capacitor coupled between the output node of the bias circuit and the second reference node. The fourth transmission line element may have a quarter wavelength at about four times a frequency of operation of the VCO, and the fifth transmission line element may have a quarter wavelength at about four times the frequency of operation of the VCO.

In an embodiment, RF choke circuit includes a second transmission line element having a first terminal coupled to the first terminal of the first transmission line element, a third transmission line element having a first node coupled to a second terminal of the second transmission line element, and a second capacitor coupled between the first node of the first transmission line and the second reference node. The VCO may include an output node coupled to the emitter terminals of the VCO core. In an embodiment, VCO comprises a frequency of operation between about 10 GHz and about 30 GHz.

In accordance with a further embodiment, a voltage controlled oscillator (VCO) includes a VCO core having a plurality of transistors, and a varactor circuit coupled to emitter terminals of the VCO core. The varactor circuit includes a first capacitor having a first terminal coupled to an emitter node of the VCO core, a first transmission line element having a first terminal coupled to a second terminal of the first capacitor, a first varactor diode having a first terminal coupled to a second terminal of the first transmission line and a second terminal coupled to a tuning node, and an RF choke circuit coupled between a second terminal of the first capacitor and a second reference node.

In an embodiment, the RF choke circuit includes a second transmission line element having a first terminal coupled to the first terminal of the first transmission line element, a third transmission line element having a first node coupled to a second terminal of the second transmission line element, and a second capacitor coupled between the first node of the first transmission line and a second reference node. The first transmission line may have a length of at least 100 µm, and the first transmission line element and the RF choke may form an inductive voltage divider. In some embodiments, the RF choke circuit has a quarter wavelength at about twice a frequency of operation of the VCO.

In an embodiment, the VCO further includes a resistor coupled between a common supply node of the VCO core and a power supply input terminal of the VCO. This resistor may have a resistance between about 1 ohm and about 20 ohms. Alternatively, other values may be used. In some embodiment, the VCO further includes a fourth transmission line element coupled between the power supply input terminal and the resistor, such that the fourth transmission line element has a quarter wavelength of about two times a frequency of operation of the VCO.

In accordance with a further embodiment, a method of operating a voltage controlled oscillator (VCO) includes applying a supply voltage to a VCO core via a resistor coupled to collector terminals of the VCO core, limiting a self-bias condition of the VCO core via the resistor, and tuning the VCO comprising applying a tuning voltage to a varactor circuit coupled to emitter terminals of the VCO core.

The method may further includes providing a signal path at the frequency of oscillation of the VCO between a tuning node and the emitter terminals of the VCO core using a first transmission line element, and coupling harmonics of the VCO to a reference node via an RF choke circuit coupled between the emitter terminals of the VCO core and the reference node. In some embodiments, the RF choke has a quarter wavelength of about two times the frequency of oscillation of the VCO.

The method may further include filtering the tuning node using a second transmission line element coupled between a tuning terminal of the VCO and the tuning node. The second transmission line element may have a quarter wavelength of about four times the frequency of oscillation of the VCO.

Advantages of embodiments of the present invention include ability to produce generate a frequency having very low phase noise. A further advantage includes, for example, a wide VCO tuning range.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. A voltage controlled oscillator (VCO) comprising:
a VCO core comprising a plurality of transistors;
a bias resistor coupled between collector terminals of the VCO core and a first reference node, wherein the bias resistor is configured to limit a self-bias condition of the VCO core; and
a varactor circuit coupled to emitter terminals of the VCO core, wherein the varactor circuit comprises
a first capacitor having a first terminal coupled to an emitter node of the VCO core,
a first transmission line element having a first terminal coupled to a second terminal of the first capacitor,
a first varactor diode having a first terminal coupled to a second terminal of the first transmission line elememt and a second terminal coupled to a tuning node, and
an RF choke circuit coupled between a second terminal of the first capacitor and a second reference node.
2. The VCO of claim 1, wherein:
the first transmission line element comprises a length of at least 100 µm; and
the RF choke circuit has a quarter wavelength at about twice a frequency of operation of the VCO.

3. The VCO of claim 1, wherein the first transmission line element and the RF choke form an inductive voltage divider.

4. The VCO of claim 1, further comprising:
a second transmission line element coupled between the tuning node and an input tuning terminal;
a second capacitor coupled between the input tuning terminal and the second reference node;
a third transmission line element coupled between a base bias node of the VCO core and an output node of a bias circuit; and
a third capacitor coupled between the output node of the bias circuit and the second reference node.

5. The VCO of claim 4, wherein:
the second transmission line element has a quarter wavelength at about four times a frequency of operation of the VCO; and
the third transmission line element has a quarter wavelength at about four times the frequency of operation of the VCO.

6. The VCO of claim 1, wherein the RF choke circuit comprises:
a second transmission line element having a first terminal coupled to the first terminal of the first transmission line element;
a third transmission line element having a first node coupled to a second terminal of the second transmission line element; and
a second capacitor coupled between the first node of the first transmission line element and the second reference node.

7. The VCO of claim 1, wherein the VCO comprises an output node coupled to the emitter terminals of the VCO core.

8. The VCO of claim 1, wherein the VCO comprises a frequency of operation between about 10 GHz and about 30 GHz.

9. A voltage controlled oscillator (VCO) comprising:
a VCO core comprising a plurality of transistors; and
a varactor circuit coupled to emitter terminals of the VCO core, wherein the varactor circuit comprises
a first capacitor having a first terminal coupled to an emitter node of the VCO core,
a first transmission line element having a first terminal coupled to a second terminal of the first capacitor,
a first varactor diode having a first terminal coupled to a second terminal of the first transmission line element and a second terminal coupled to a tuning node, and
an RF choke circuit coupled between a second terminal of the first capacitor and a second reference node.

10. The VCO of claim 9, wherein the RF choke circuit comprises:
a second transmission line element having a first terminal coupled to the first terminal of the first transmission line element,
a third transmission line element having a first node coupled to a second terminal of the second transmission line element, and
a second capacitor coupled between the first node of the first transmission line element and a second reference node.

11. The VCO of claim 9, wherein the first transmission line element comprises a length of at least 100 μm.

12. The VCO of claim 9, wherein the first transmission line element and the RF choke form an inductive voltage divider.

13. The VCO of claim 9, wherein the RF choke circuit has a quarter wavelength at about twice a frequency of operation of the VCO.

14. The VCO of claim 9, further comprising a resistor coupled between a common supply node of the VCO core and a power supply input terminal of the VCO.

15. The VCO of claim 14, wherein the resistor has a resistance between about 1 ohm and about 20 ohms.

16. The VCO of claim 14, further comprising a second transmission line element coupled between the power supply input terminal and the resistor, wherein the second transmission line element has a quarter wavelength of about two times a frequency of operation of the VCO.

17. A method of operating a voltage controlled oscillator (VCO), the method comprising:
applying a supply voltage to a VCO core via a resistor coupled to collector terminals of the VCO core;
limiting a self-bias condition of the VCO core via the resistor;
tuning the VCO comprising applying a tuning voltage to a varactor circuit coupled to emitter terminals of the VCO core;
providing a signal path at a frequency of oscillation of the VCO between a tuning node and the emitter terminals of the VCO core using a first transmission line element; and
coupling harmonics of the VCO to a reference node via an RF choke circuit coupled between the emitter terminals of the VCO core and the reference node.

18. The method of claim 17, wherein the RF choke has a quarter wavelength of about two times the frequency of oscillation of the VCO.

19. The method of claim 17, further comprising filtering the tuning node using a second transmission line element coupled between a tuning terminal of the VCO and the tuning node.

20. The method of claim 19, wherein the second transmission line element has a quarter wavelength of about four times the frequency of oscillation of the VCO.

* * * * *

UNITED STATES PATENT AND TRADEMARK OFFICE
CERTIFICATE OF CORRECTION

| | | |
|---|---|---|
| PATENT NO. | : 9,099,958 B2 | Page 1 of 1 |
| APPLICATION NO. | : 14/041931 | |
| DATED | : August 4, 2015 | |
| INVENTOR(S) | : Saverio Trotta | |

It is certified that error appears in the above-identified patent and that said Letters Patent is hereby corrected as shown below:

In the claims

In Col. 8, line 59, claim 1, delete "elememt" and insert --element--.

Signed and Sealed this
Fifteenth Day of December, 2015

Michelle K. Lee
*Director of the United States Patent and Trademark Office*